(12) United States Patent
Haraguchi et al.

(10) Patent No.: US 6,483,746 B2
(45) Date of Patent: Nov. 19, 2002

(54) ELECTRONIC APPARATUS

(75) Inventors: Masahiko Haraguchi, Chikushino (JP);
Hiromi Katagawa, Onojo (JP)

(73) Assignee: Matsushita Electronic Industrial Co., Ltd., Osaka (JP)

( * ) Notice: Subject to any disclaimer, the term of this patent is extended or adjusted under 35 U.S.C. 154(b) by 0 days.

(21) Appl. No.: 09/860,456

(22) Filed: May 21, 2001

(65) Prior Publication Data

US 2001/0046157 A1 Nov. 29, 2001

(30) Foreign Application Priority Data

May 24, 2000 (JP) ........................................ 2000-152402

(51) Int. Cl.$^7$ .............................................. G11C 16/00
(52) U.S. Cl. ............................. 365/185.08; 365/185.04
(58) Field of Search ....................... 365/185.08, 185.04, 365/52, 63

(56) References Cited

U.S. PATENT DOCUMENTS 5,909,391 A * 6/1999 Loibl .................... 365/185.08
6,104,638 A * 8/2000 Larner et al. .......... 365/185.04

* cited by examiner

*Primary Examiner*—Tan T. Nguyen
(74) *Attorney, Agent, or Firm*—Stevens, Davis, Miller & Mosher, LLP

(57) ABSTRACT

There is provided an electronic apparatus that can recover easily even when failing to update version up of a program and can be started without resort to special operation even when the program changes to change the storage format of setting information. The apparatus has a central processing unit for controlling the whole of the apparatus, a writable and nonvolatile memory for storing programs and setting information and a random access memory uses as a work area. The nonvolatile memory has at least three program areas.

17 Claims, 6 Drawing Sheets

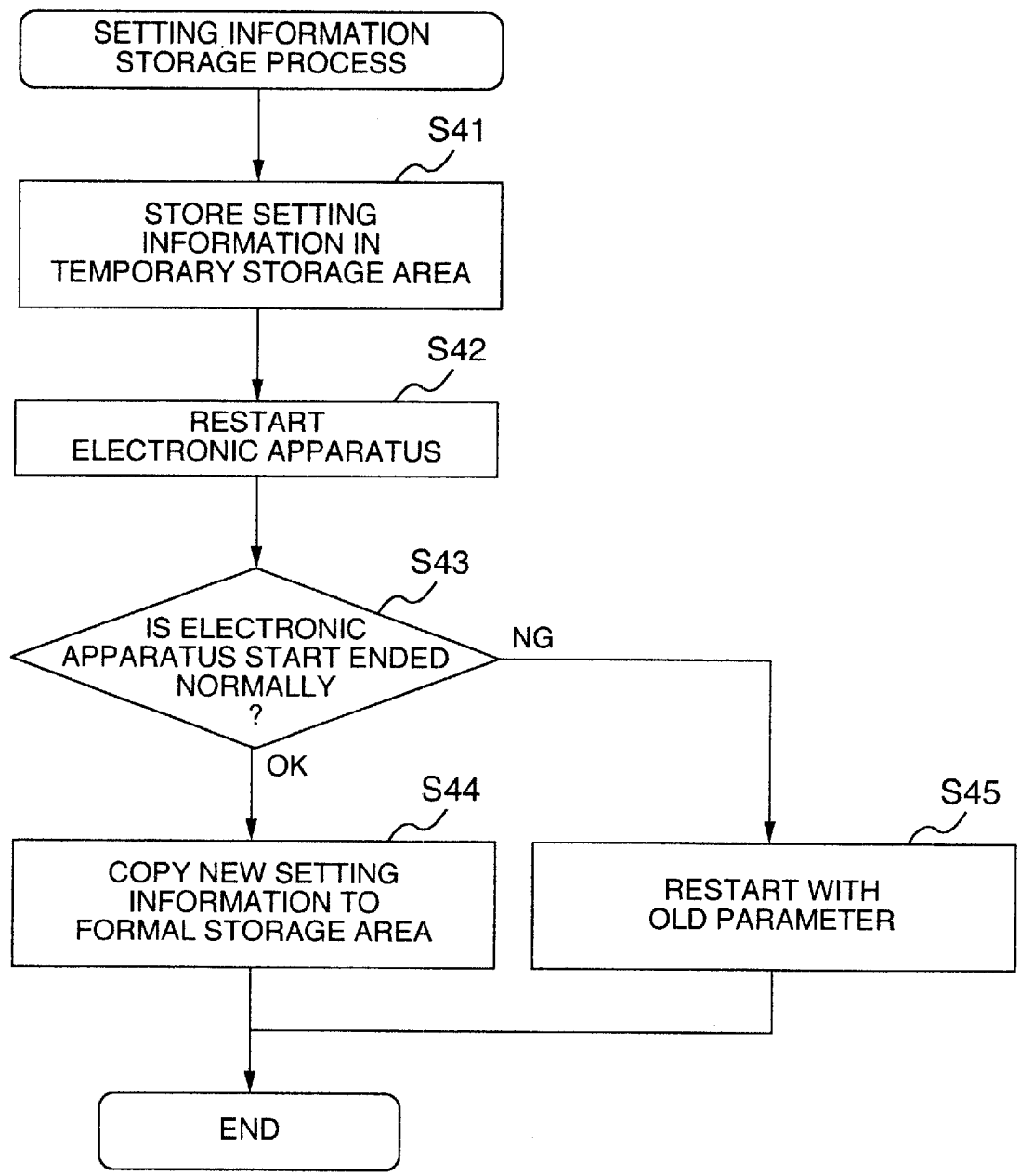

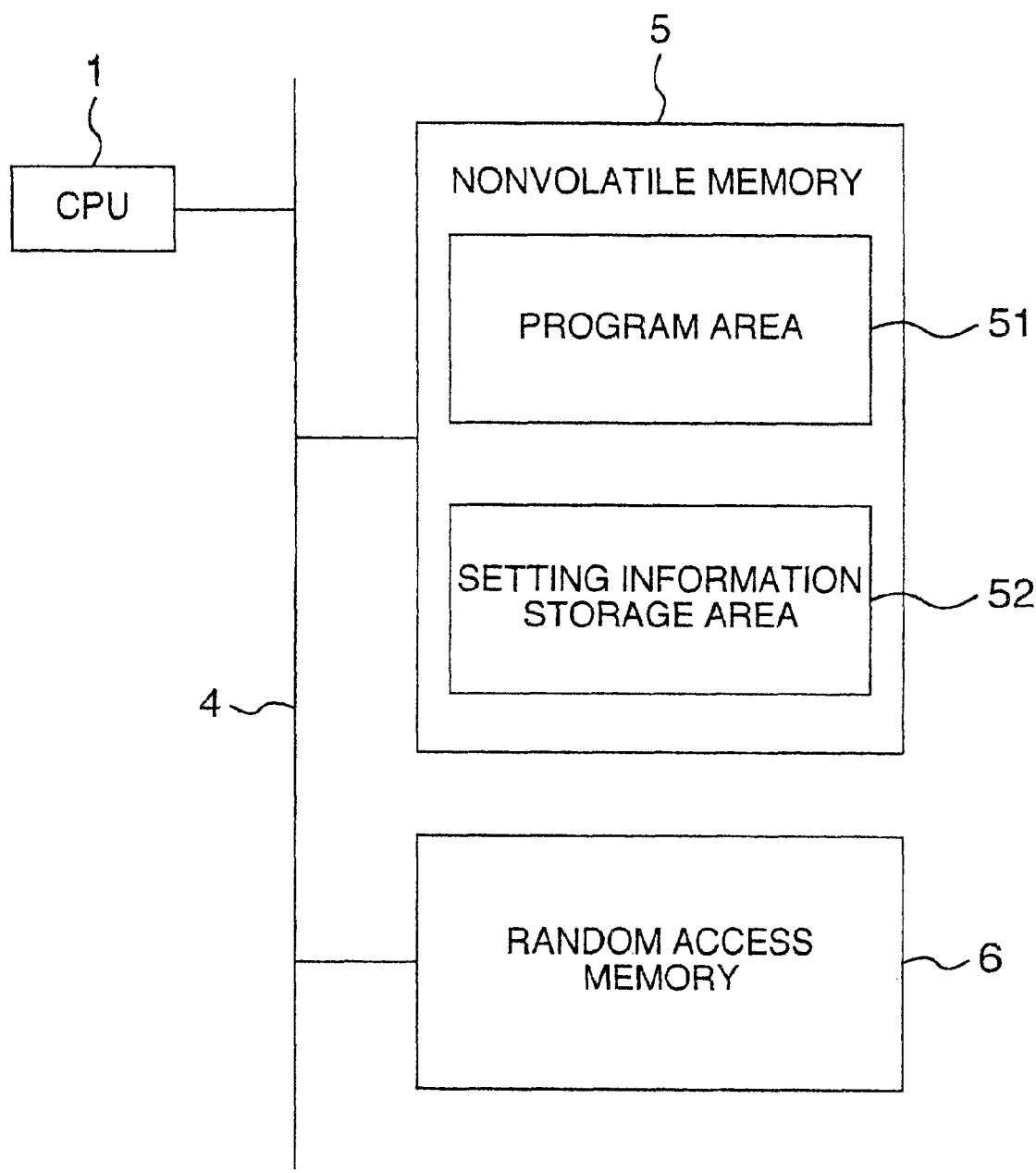

ELECTRONIC APPARATUS

BACKGROUND OF THE INVENTION

The present invention relates to an electronic apparatus having programs and setting information.

The conventional electronic apparatus is comprised of a CPU (central processing unit), a non-writable and nonvolatile memory area for storing programs, a writable and nonvolatile memory area for storing setting information and a random access memory area used as a work area and most of them do not comply with update of programs. Therefore, electronic apparatus capable of complying with update of programs have recently been increasing in number.

A conventional electronic apparatus shown in block form in FIG. 6 is constructed of a CPU, a writable and nonvolatile memory for storing programs and setting information and a random access memory used as a work area so as to be able to comply with update of programs.

In FIG. 6, reference numeral 1 designates a CPU (central processing unit) for controlling the whole of the apparatus, 5 the writable and nonvolatile memory for storing programs and setting information, 6 the random access memory used as a work area, 4 a bus for coupling the CPU 1 to the memories 5 and 6, 51 a program area for storing the programs and 52 a setting information storage area for storing the setting information.

In FIG. 6, the area 51 for storage of programs is limited in number to one and in the event that an update of a program externally operated fails, the electronic apparatus cannot sometimes be started again. Further, in a conventional electronic apparatus not taking version up of programs into consideration, no mismatch takes place between the program and the setting information but in the case of an electronic apparatus considering version up of programs, such a restriction that a new program should not fail to understand the setting information till then is imposed on development of the apparatus when version up of a program is to be carried out, resulting in a problem that unless this restriction is met, the program cannot be started.

As described above, the conventional electronic apparatus face problems that when an update fails during update of a program in the electronic apparatus, the electronic apparatus is sometimes prevented from recovering and that the storage format of setting information must remain unchanged concomitantly with update of programs.

This type of electronic apparatus is therefore required to have ability to recover easily even in the event that the electronic apparatus fails to update version up of a program and ability to start without resort to special operation even when a change of program occurs that causes the storage format of the setting information to change.

SUMMARY OF THE INVENTION

An object of the present invention is to provide an electronic apparatus that can recover easily even when failing to update version up of a program and can start without resort to special operation even when a change of program occurs that causes the storage format of setting information to change.

To accomplish the above object, an electronic apparatus according to the invention comprises a central processing unit for controlling the whole of the apparatus, a writable and nonvolatile memory for storing programs and setting information and a random access memory used as a work area, wherein the nonvolatile memory includes at least three program areas.

With this construction, an electronic apparatus can be obtained which can recover easily even when failing to update version up of a program.

BRIEF DESCRIPTION OF THE DRAWINGS

FIG. 5 is a flowchart showing a procedure for setting information storage process in the electronic apparatus of FIG. 1.

FIG. 6 is a block diagram showing a conventional electronic apparatus.

DETAILED DESCRIPTION OF THE EMBODIMENTS

Embodiments of the invention will now be described with reference to FIGS. 1 to 5.

Embodiment 1

Figure 1:
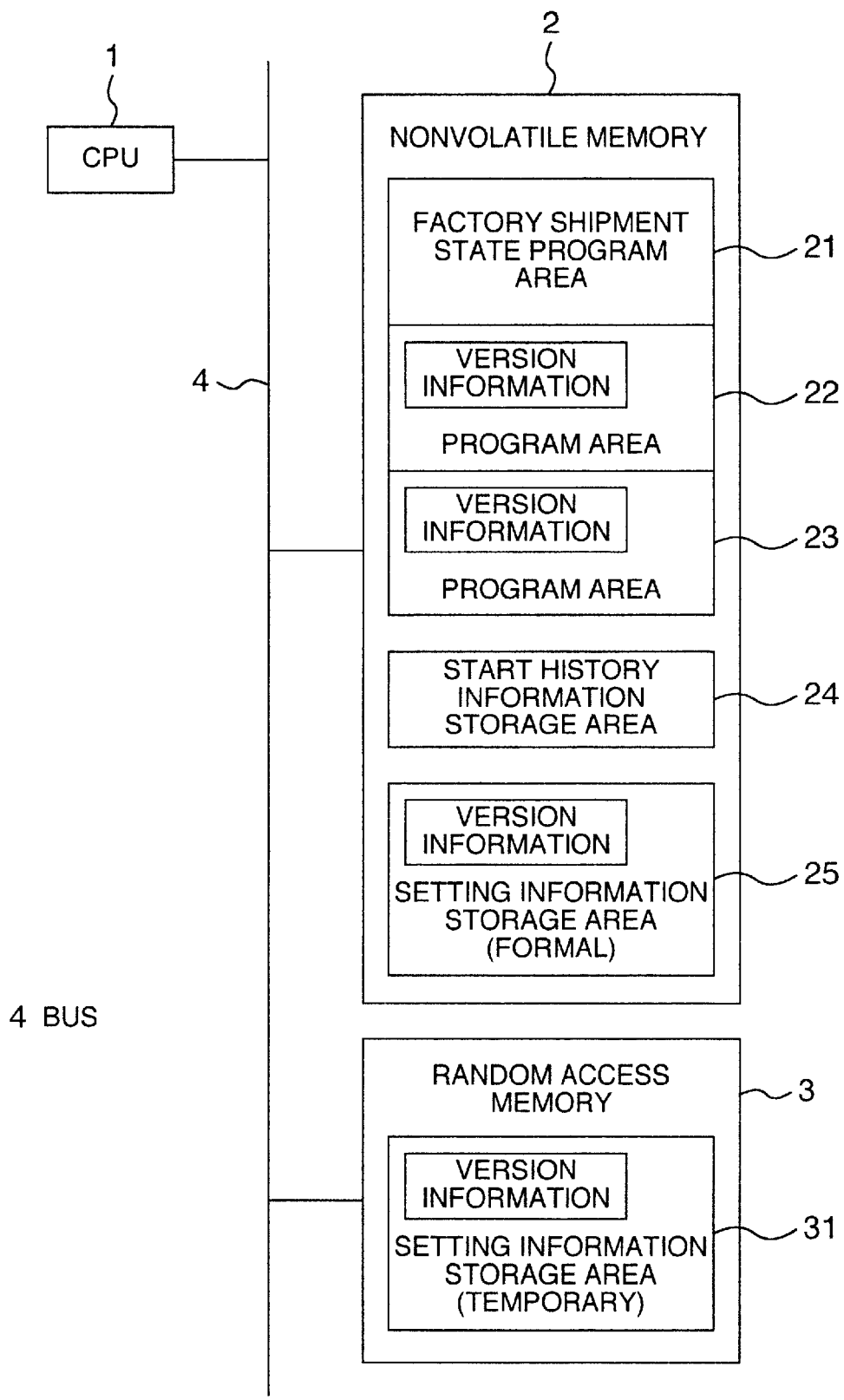
FIG. 1 is a block diagram showing an electronic apparatus used in common to embodiments 1, 2 and 3 of the invention.

Referring first to FIG. 1, there is illustrated, in block form, an electronic apparatus for practicing embodiments of the invention.

In FIG. 1, a CPU (central processing unit) 1 controls the whole of the apparatus, a nonvolatile memory 2 has three program areas 21 to 23 (factory shipment state program area 21 and program areas 22 and 23), a start history information storage area 24 and a formal setting information storage area 25, a random access memory 3 has a temporary setting information storage area 31, and a bus 4 couples the CPU 1 to the individual memories 2 and 3.

Figure 2:
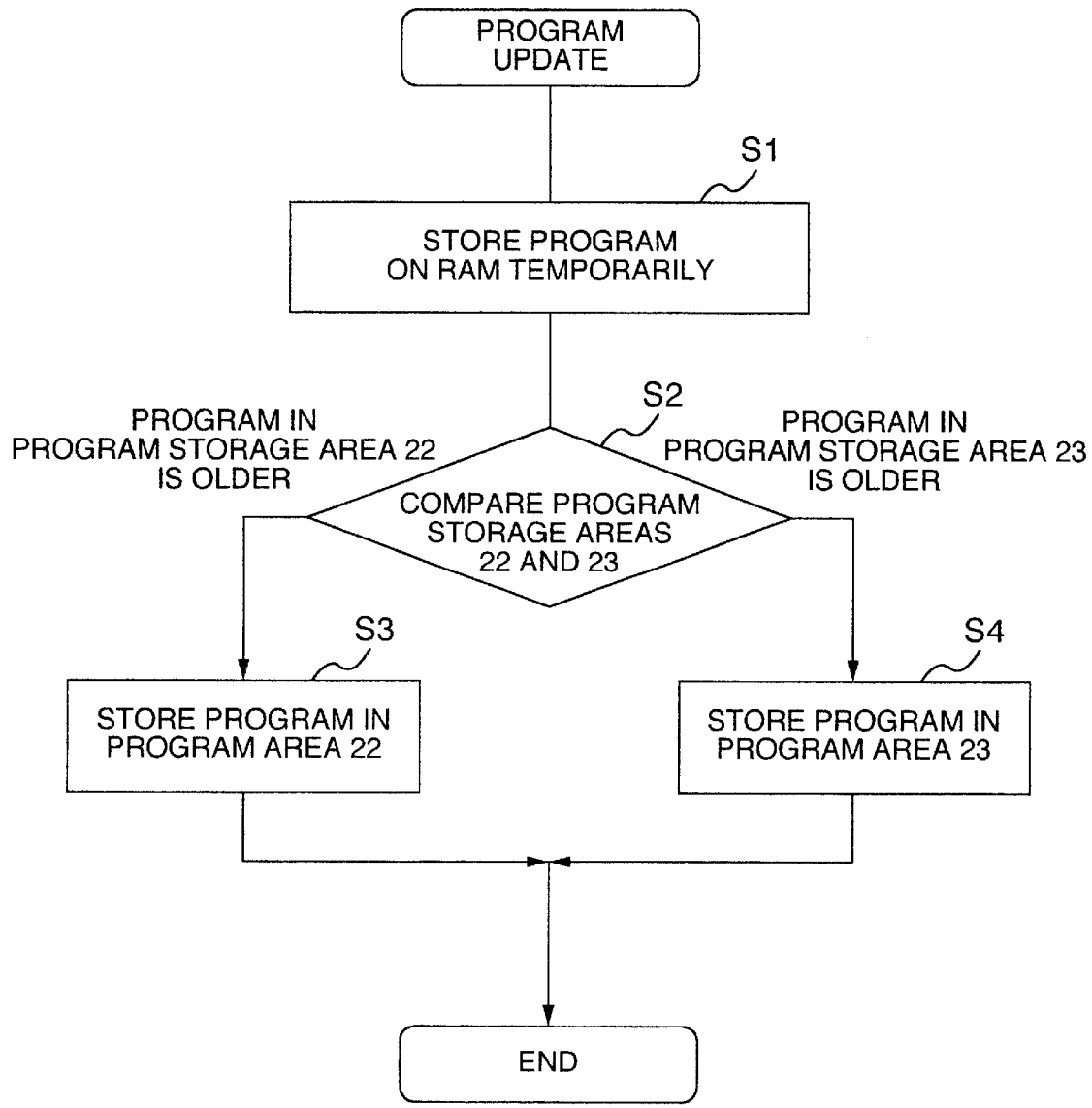
FIG. 2 is a flowchart showing a program update procedure in the electronic apparatus of FIG. 1.

A procedure for update of a program in the electronic apparatus constructed as above will be described with reference to FIG. 2, which is a flowchart showing the program update procedure in the electronic apparatus of FIG. 1. The CPU 1 executes all operations indicated in FIG. 2.

In case a program is updated, the latest program is once stored temporarily on the random access memory 3 (S1). Then, versions of programs stored in the program areas 22 and 23 on the nonvolatile memory 2 are respectively taken out and compared with each other (S2) and the program on the random access memory 3 is stored in the program area in which a program of old version has been stored (S3, S4). At that time, the factory shipment state program area 21 is constantly placed in protective condition for preventing its content from being rewritten.

Thus, according to the present embodiment, even when the program cannot be updated because of a failure of program update, a currently operating program (namely, a program of new version) remains on the nonvolatile memory 2 and the electronic apparatus can be started as before. Further, the content of the factory shipment state program is impermissible for rewrite and therefore, even if the program does not operate for some reasons, the electronic apparatus can be started with the factory shipment state program, thereby ensuring that the electronic apparatus highly guarded against faults can be constructed.

Embodiment 2

Embodiment 2 of the invention is practiced with the electronic apparatus constructed as shown in FIG. 1, as in the case of the embodiment 1.

Figure 3:
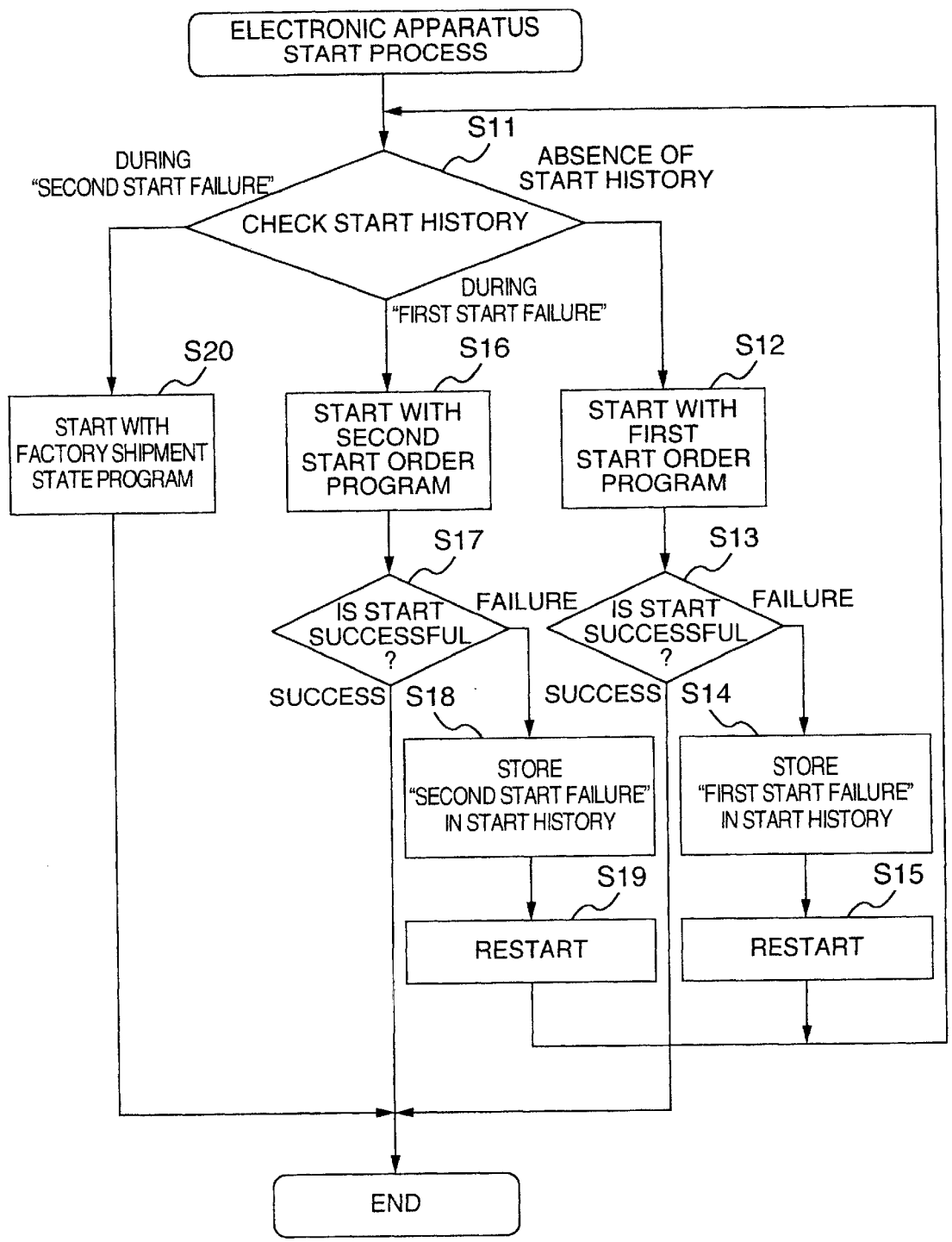
FIG. 3 is a flowchart showing a procedure for start process in the electronic apparatus of FIG. 1.

A procedure for start process in the electronic apparatus will be described with reference to FIG. 3, which is a flowchart showing the start process procedure in the FIG. 1 electronic apparatus. Operation shown in FIG. 3 is totally executed by the CPU 1.

During start of the electronic apparatus, a start history is first checked on the basis of start history information stored in the start history information storage area 24 (S11). If start up has been normal till then, nothing has been described in the start history. Accordingly, with nothing described in the start history, the electronic apparatus is started with a first start order program (S12). Versions of programs stored in the respective program areas 22 and 23 are compared with each other to obtain the latest program that is selected as the first start order program. It is now assumed that the latest program is stored in the program storage area 22. In that case, the electronic apparatus is started with the program in the program storage area 22. If the electronic apparatus succeeds in starting (S13), the start process of the electronic apparatus ends. If the electronic apparatus fails to start, "first start failure" is stored in the start history information storage area 24 (S14) and the program proceeds to a restart step (S15). Then, the start history is again checked (S11) and with the "first start failure" stored in the start history information storage area 24, start with a second start order program is tried (S16). Versions of programs stored in the respective program storage areas 22 and 23 are compared with each other to obtain a secondly new program (also called an old program because the two program areas 22 and 23 are assumed herein) that is selected as the second start order program. Thus, the program in the program storage area 23 is now used for starting. If start with this program succeeds (S17), the start process of the electronic apparatus ends. If start fails with this program, "second start failure" is stored in the start history information storage area 24 (S18) and the program proceeds to a restart step (S19). The start history is again checked (S11) and with the "second start failure" stored in the start history information storage area 24, start with the factory shipment state program is tried (S20). The factory shipment state program is a program that has never been updated since factory shipment and therefore start with this program never fails.

As described above, according to the present embodiment, even under a condition that the program update fails and the electronic apparatus cannot start with the latest program, the electronic apparatus can be started with the program before update. In addition, even if the program update failure affects the program before update, the electronic apparatus can be started with the factory shipment state program, with the result that a failure to start the electronic apparatus can be prevented and besides by virtue of the factory shipment state program having the built-in function to update programs which is utilized to retry update to the latest program, the electronic apparatus highly guarded against faults can be constructed.

Embodiment 3

Embodiment 3 of the invention can be practiced with the electronic apparatus constructed as shown in FIG. 1, as in the case of the embodiment 1.

Figure 4:
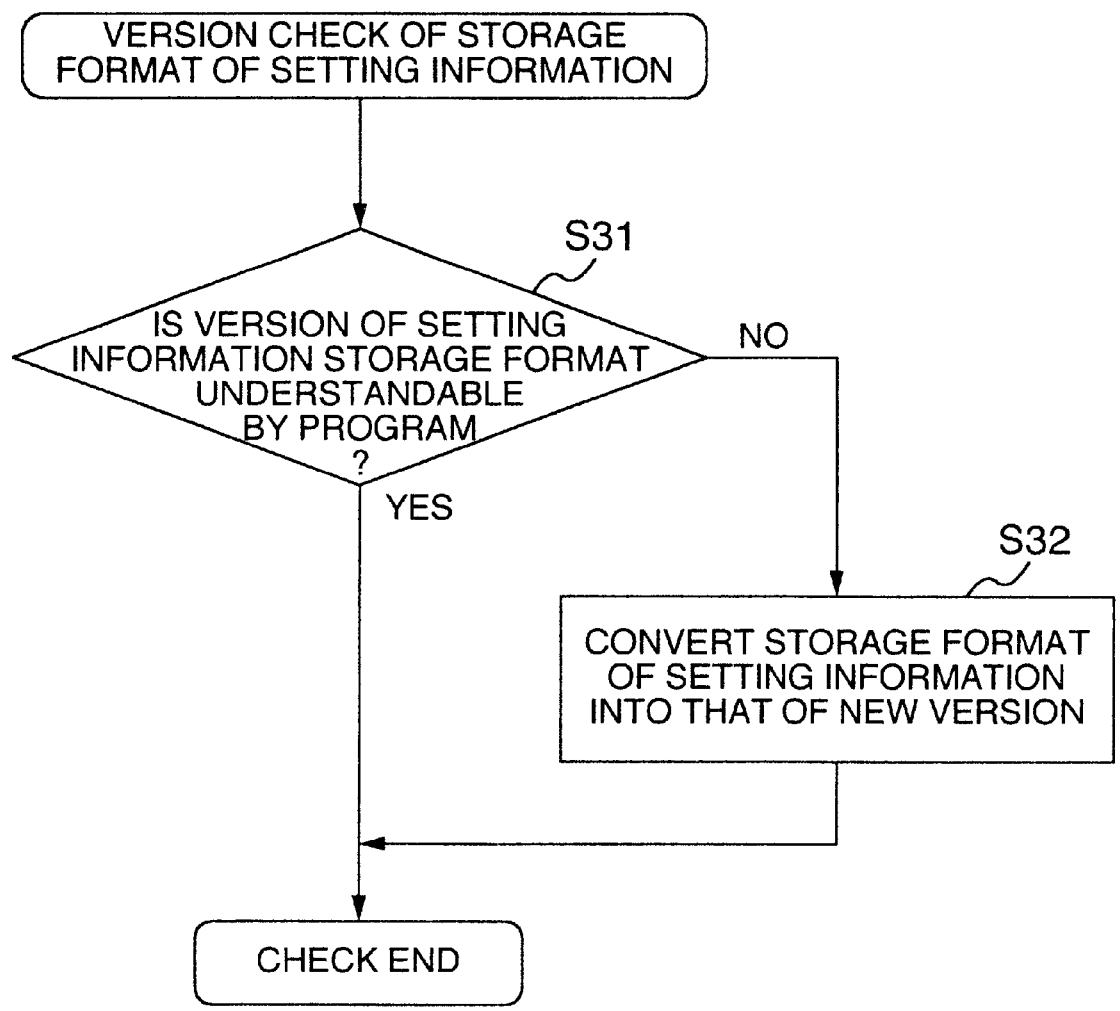
FIG. 4 is a flowchart showing a procedure for version check of setting information storage format in the electronic apparatus of FIG. 1.

A procedure for version check of setting information storage format in the thus constructed electronic apparatus will be described with reference to FIG. 4. FIG. 4 is a flowchart showing the procedure for version check of setting information storage format in the FIG. 1 electronic apparatus. Operation shown in FIG. 4 is totally executed by the CPU 1.

During start of the electronic apparatus, it is checked whether a version of the setting information storage format is understandable by the program (S31). If so, the present version checking process ends. If not so, the storage format of setting information is converted through some conversion methods (S32).

If the conversion methods and conversion based thereon are not undertaken, the following procedures will be dealt with.

(1) Conversion is carried out in the course of the start process of a new program.

(2) A server for performing version conversion of the storage format of setting information is prepared on a network and after the apparatus has been connected to the server to have the storage format converted, the converted storage format is again stored in the electronic apparatus to start it.

(3) Without performing conversion of the storage format of setting information, a new storage format placed in initial condition is stored in the electronic apparatus to start it.

(4) Without performing conversion of the storage format of setting information, start up is done with a program of previous version.

According to the present embodiment, even under a condition that the storage format of setting information stored in the electronic apparatus is caused to undergo, by update of a program, a change in format incomprehensible by the latest program, the storage format of setting information can be converted into one interpretable by the latest program and such a trouble that the electronic apparatus is prevented from starting can be avoided. When it is presupposed that the setting information is set after starting, the setting information storage format may be cleared temporarily by the latest state and then start up may be done. Further, if an update of a program is unasked, start up can be done with the previous program.

Embodiment 4

Embodiment 4 of the invention is practiced with the electronic apparatus constructed as shown in FIG. 1, as in the case of the embodiment 1.

A procedure for setting information storage process in the electronic apparatus will be described. FIG. 5 is a flowchart showing the setting information storage process procedure in the FIG. 1 electronic apparatus.

When change of setting information is desired, the setting information is first stored in the temporary setting information storage area 31 (S41). Under this condition, the electronic apparatus is restarted (S42). During restart of the electronic apparatus in the step S42, the electronic apparatus is started using the setting information stored in the temporary setting information storage area 31. If this electronic apparatus start is successful (S43), the setting information that has been stored in the temporary setting information storage area 31 is copied to the formal setting information storage area 25 (S44). If the start is unsuccessful, the apparatus is again restarted with setting information representing one before update that has been stored in the formal setting information storage area 25 (S45).

As described above, according to the present embodiment, even under a condition that unsuitable setting is done during update of setting information to make start up of the electronic apparatus unsuccessful, the electronic apparatus can be restarted under the previous condition and such a trouble that the electronic apparatus is prevented from starting can be avoided.

What is claimed is:

1. An electronic apparatus, comprising:
    a central processing unit for controlling the whole of said electronic apparatus;
    a writable and nonvolatile memory for storing programs and setting information; and
    a random memory for use as a work area,
    said nonvolatile memory having at least three program areas, wherein said nonvolatile memory has a factory shipment state program area for storing a factory shipment state program.

2. An electronic apparatus according to claim 1, wherein a program stored in one of said at least three program areas that is stored with the latest program is defined as a first start program and, when said electronic apparatus cannot be started using the program in program area designated as said first start program and said central processing unit starts programs in program areas storing other programs than said first start program for the sake of starting said electronic apparatus until said electronic apparatus is started to result in a failure to start said electronic apparatus with any started programs, said central processing unit starts said electronic apparatus by reading said factory shipment state program into said random access memory.

3. An electronic apparatus according to claim 2, wherein said nonvolatile memory is protected such that program update is impermissible in the program area stored with said factory shipment state program.

4. An electronic apparatus according to claim 1, wherein a program stored in one of said at least three program areas is defined as a first start program and, when said electronic apparatus cannot be started using the program in program area designated as said first start program and said central processing unit starts programs in program areas storing programs that are new in sequence for the sake of starting said electronic apparatus until said electronic apparatus is started to result in a failure to start said electronic apparatus with any started programs, said central processing unit starts said electronic apparatus by reading and writing said factory shipment state program into said random access memory.

5. An electronic apparatus according to claim 4, wherein said nonvolatile memory is protected ouch that program update is impermissible in the program area stored with said factory shipment state program.

6. An electronic apparatus according to claim 1, wherein said nonvolatile memory is protected such that program update is impermissible in the program area stored with said factory shipment state program.

7. An electronic apparatus, comprising:
    a central processing unit for controlling the whole of said electronic apparatus;
    a writable and nonvolatile memory for storing programs and setting information; and
    a random memory for use as a work area,
    said nonvolatile memory having at least three program areas, wherein when a new program is stored in said non-volatile memory, said central processing unit stores the new program in a program area other than the program area in which the latest program is stored.

8. An electronic apparatus, comprising:
    a central processing unit for controlling the whole of said electronic apparatus;
    a writable and nonvolatile memory for storing programs and setting information; and
    a random memory for use as a work area,
    said nonvolatile memory having at least three program areas, wherein a program stored in one of said at least three program areas that is stored with the latest program is defined as a first start program and said central processing unit starts said electronic apparatus by reading and writing said first start program into said random access memory.

9. An electronic apparatus, comprising:
    a central processing unit for controlling the whole of said electronic apparatus;
    a writable and nonvolatile memory for storing programs and setting information; and
    a random memory for use as a work area,
    said nonvolatile memory having at least three program areas, wherein a program stored in one of said at least three program areas that is stored with the latest program is defined as a first start program and when said electronic apparatus cannot be started using the program in program area designated as said first start program, said central processing unit reads and writes programs in program areas storing other programs than said first start program into said random access memory for the sake of starting said electronic apparatus until said electronic apparatus is started.

10. An electronic apparatus according to claim 9, wherein said nonvolatile memory is protected such that program update is impermissible in the program area stored with said factory shipment state program.

11. An electronic apparatus, comprising:
    a central processing unit for controlling the whole of said electronic apparatus;
    a writable and nonvolatile memory for storing programs and setting information; and
    a random memory for use as a work area,
    said nonvolatile memory having at least three program areas, wherein a program stored in one of said at least three program areas that is stored with the latest program is defined as a first start program and when said electronic apparatus cannot be started using the program in program area designated as said first start program, said central processing unit reads and writes programs in program areas storing programs that are new in sequence into said random access memory for the sake of starting said electronic apparatus until said electronic apparatus is started.

12. An electronic apparatus according to claim 11, wherein said nonvolatile memory is protected such that program update is impermissible in the program area stored with said factory shipment state program.

13. An electronic apparatus, comprising:
    a central processing unit for controlling the whole of said electronic apparatus;
    a writable and nonvolatile memory for storing programs and setting information; and
    a random access memory for use as a work area,
    wherein versions of a storage format of setting information of the electronic apparatus used by said programs are set and said central processing unit manages correspondence between ones of said versions owned by individual programs and ones of said versions owned by the storage format of the individual setting information, wherein when a program used for starting said electronic apparatus cannot understand a version of the storage format of the presently stored setting information of said electronic apparatus, said central processing unit starts said electronic apparatus with a second new program.

14. An electronic apparatus, comprising:

a central processing unit for controlling the whole of said electronic apparatus;

a writable and nonvolatile memory for storing programs and setting information; and a random access memory for use as a work area, wherein versions of a storage format of setting information of the electronic apparatus used by said programs are set and said central processing unit manages correspondence between ones of said versions owned by individual programs and ones of said versions owned by the storage format of the individual setting information, wherein when a version of the storage format of setting information of the electronic apparatus used by an updated new program does not coincide with a version of the storage format of setting information used by an old program, said central processing unit converts the storage format of the setting information into the storage format used by said updated new program and then restarts said electronic apparatus.

15. An electronic apparatus, comprising:

a central processing unit for controlling the whole of said electronic apparatus;

a writable and nonvolatile memory for storing programs and setting information; and a random access memory for use as a work area, wherein versions of a storage format of setting information of the electronic apparatus used by said programs are net and said central processing unit manages correspondence between ones of said versions owned by individual programs and ones of said versions owned by the storage format of the individual setting information, wherein when a version of the storage format of setting information of the electronic apparatus used by an updated new program does not coincide with a version of the storage format of setting information used by an old program, said central processing unit converts the storage format of the setting information into the storage format used by said updated new program through a data format conversion server on an internet, stores the converted format in said nonvolatile memory or said random access memory and thereafter starts said electronic apparatus.

16. An electronic apparatus, comprising:

a central processing unit for controlling the whole of said electronic apparatus;

a writable and nonvolatile memory for storing programs and setting information; and a random access memory for use as a work area, wherein versions of a storage format of setting information of the electronic apparatus used by said programs are set and said central processing unit manages correspondence between ones of said versions owned by individual programs and ones of said versions owned by the storage format of the individual setting information, wherein when a version of the storage fort of setting information of the electronic apparatus used by an updated new program does not coincide with a version of the storage format of setting information used by an old program, said central processing unit returns the setting information to an initial state of the version of the storage format used by said updated new program and then starts said electronic apparatus.

17. An electronic apparatus, comprising:

a central processing unit for controlling the whole of said electronic apparatus;

a writable and nonvolatile memory for storing programs and setting information; and a random access memory for use as a work area, wherein versions of a storage format of setting information of the electronic apparatus used by said programs are set and said central processing unit manages correspondence between ones of said versions owned by individual programs and ones of said versions owned by the storage format of the individual setting information, wherein when setting information of the electronic apparatus used by a program is updated, said central processing unit restarts said electronic apparatus to confirm that said electronic apparatus operates normally and then stores updated setting information, as formal setting information, in a setting information storage area of said nonvolatile memory.

* * * * *